(12) United States Patent
Tung et al.

(10) Patent No.: US 7,665,509 B2
(45) Date of Patent: Feb. 23, 2010

(54) HEAT EXCHANGE MODULE FOR ELECTRONIC COMPONENTS

(75) Inventors: Chao-Nien Tung, Guangdong (CN);
Chih-Hao Yang, Guangdong (CN);
Chuen-Shu Hou, Guangdong (CN)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 870 days.

(21) Appl. No.: 11/307,154

(22) Filed: Jan. 25, 2006

(65) Prior Publication Data
US 2007/0000645 A1 Jan. 4, 2007

(30) Foreign Application Priority Data
Jul. 2, 2005 (CN) .................... 2005 1 0035780

(51) Int. Cl.
*H05K 7/20* (2006.01)
(52) U.S. Cl. .............. 165/104.26; 165/104.33; 361/697
(58) Field of Classification Search ............ 165/104.26, 165/104.33; 361/697, 700
See application file for complete search history.

(56) References Cited

U.S. PATENT DOCUMENTS

| | | | |
|---|---|---|---|
| 5,647,430 A * | 7/1997 | Tajima .................. | 165/104.33 |
| 6,381,135 B1 | 4/2002 | Prasher | |
| 6,779,595 B1 * | 8/2004 | Chiang ................... | 165/104.33 |
| 6,808,013 B2 * | 10/2004 | Lai et al. .................... | 165/80.4 |
| 6,967,845 B2 * | 11/2005 | Chiang et al. ............... | 361/709 |
| 7,431,071 B2 * | 10/2008 | Wenger ....................... | 165/47 |
| 2002/0062648 A1 * | 5/2002 | Ghoshal ...................... | 62/3.7 |
| 2003/0011990 A1 * | 1/2003 | Lai et al. ..................... | 361/697 |
| 2004/0070941 A1 * | 4/2004 | Ghosh et al. ................ | 361/700 |
| 2005/0217829 A1 * | 10/2005 | Belits et al. ............ | 165/104.33 |
| 2006/0102324 A1 * | 5/2006 | Mok et al. ............. | 165/104.33 |
| 2006/0175043 A1 * | 8/2006 | Peng ..................... | 165/104.26 |
| 2006/0289149 A1 * | 12/2006 | He ......................... | 165/104.33 |

FOREIGN PATENT DOCUMENTS

| CN | 2457554 Y | 10/2001 |
|---|---|---|
| CN | 2569345 Y | 8/2003 |

* cited by examiner

*Primary Examiner*—Allen J Flanigan
(74) *Attorney, Agent, or Firm*—Winston Hsu

(57) ABSTRACT

A heat exchange module (1) is disclosed, which includes an evaporator (20), a condenser (50) and a heat sink (22). The evaporator defines therein a chamber for containing a wick structure (20c) saturated with a working fluid. The wick structure occupies a portion of the chamber. The condenser is disposed adjacent to the evaporator, wherein the working fluid turns into vapor in the evaporator after absorbing heat of a heat-generating component and the vapor turns into condensate at the condenser after releasing the heat. The heat sink is attached to an outer surface of the evaporator and located in alignment with the wick structure contained in the evaporator.

11 Claims, 9 Drawing Sheets

HEAT EXCHANGE MODULE FOR ELECTRONIC COMPONENTS

FIELD OF THE INVENTION

The present invention relates generally to an apparatus for transfer or dissipation of heat from heat-generating components, and more particularly to a heat exchange module applicable for removing heat from heat-generating electronic components, wherein the heat exchange module has a loop-type heat exchange device.

DESCRIPTION OF RELATED ART

It is well known that heat is produced by electronic components such as integrated circuit chips during their normal operations. If not timely removed, the generated heat will produce a negative effect to the workability and stability of these electronic components. Therefore, heat-dissipating devices are commonly required to cool these electronic components.

As an example, a conventional heat-dissipating device generally includes a heat pipe, a heat sink attached to the heat pipe and an electric fan used for producing a forced airflow towards the heat sink. The heat pipe is usually a vacuum casing containing therein a working fluid. A wick structure is preferably provided inside the heat pipe, lining an inner wall of the casing. The heat pipe has an evaporating section for being maintained in thermal contact with a heat-generating component such as a central processing unit (CPU) of a computer, and a condensing section to which the heat sink is attached. When the heat of the CPU is inputted into the heat pipe via its evaporating section, the working fluid contained therein absorbs the heat and turns into vapor. Due to the difference of vapor pressure between the two sections of the heat pipe, the generated vapor moves, with the heat being carried, towards the condensing section where the vapor is condensed into condensate after it releases the heat to the attached heat sink. The heat sink, in combination with the electric fan, further dissipates the heat into ambient environment. The condensate in the condensing section of the heat pipe is then drawn back by the wick structure to the evaporating section where it is again available for evaporation.

As progress continues to be made in electronic industries, electronic components are produced to have more powerful functions while maintaining an unchanged size or even a smaller size. As a result, the amount of heat generated by these electronic components during their normal operations is commensurately increased, in which case the heat-dissipating devices used to cool these electronic components are required to have a larger heat removal capacity. Thus, many proposed solutions have been made to the foregoing conventional heat-dissipating device in attempt to increase its heat removal capacity, such as adopting multiple heat pipes, increasing the diameter of the heat pipe or increasing the surface area of the heat sink. However, these proposed solutions are ineffective or inapplicable in many applications. As described above, the movement of the vapor is countercurrent to that of the condensate in the heat pipe. As a result of the relative movements of the vapor and the condensate, a shearing force is induced in the heat pipe, which will produce a resistance to the flow of the condensate. If the condensate is not timely sent back to the evaporating section, the heat pipe will suffer a dry-out problem at that section.

Currently, a loop-type heat exchange device has been proposed in order to overcome the foregoing drawback of the heat pipe. The loop-type heat exchange device generally includes an evaporator, a condenser, a vapor conduit and a liquid conduit. The evaporator contains therein a working fluid. The vapor and liquid conduits each are connected between the evaporator and the condenser by two individual pipes. In operation, the working fluid in the evaporator evaporates into vapor after absorbing the heat from the CPU, and the generated vapor then flows, via the vapor conduit, to the condenser where the vapor is condensed into condensate after its latent heat of evaporation is released. The condensate then returns back to the evaporator via the liquid conduit for being available again for evaporation, thus forming a heat transfer loop.

In the loop-type heat exchange device, the vapor and the condensate are supposed to flow in the vapor and liquid conduits, respectively, and do not interfere with each other. However, since both the vapor and liquid conduits are connected to the evaporator, if there is no effective mechanism provided in the heat exchange device to maintain the unidirectional working fluid movement along the heat transfer loop, a portion of the vapor generated in the evaporator will possibly move backwards towards and finally enter into the liquid conduit. This portion of vapor flowing backwards will produce significant resistance to the condensate to return back to the evaporator along the liquid conduit, whereby a dry-out problem like that occurred in the heat pipe as set forth above may also happen in the loop-type heat exchange device.

Therefore, it is desirable to provide a heat exchange module having a loop-type heat exchange device which overcomes the foregoing disadvantages.

SUMMARY OF INVENTION

The present invention relates to a heat exchange module for removing heat from a heat-generating electronic component. The heat exchange module includes a loop-type heat exchange device having an evaporator, a condenser and a heat sink. The evaporator defines therein a chamber for containing a wick structure saturated with a working fluid. The wick structure occupies a portion of the chamber. The condenser is disposed adjacent to the evaporator, wherein the working fluid turns into vapor in the evaporator after absorbing the heat of the heat-generating electronic component and the vapor turns into condensate at the condenser after releasing the heat. The heat sink is attached to an outer surface of the evaporator and is located in alignment with the wick structure contained in the evaporator.

Other advantages and novel features of the present invention will become more apparent from the following detailed description of preferred embodiment when taken in conjunction with the accompanying drawings, in which:

DETAILED DESCRIPTION

Figure 1:
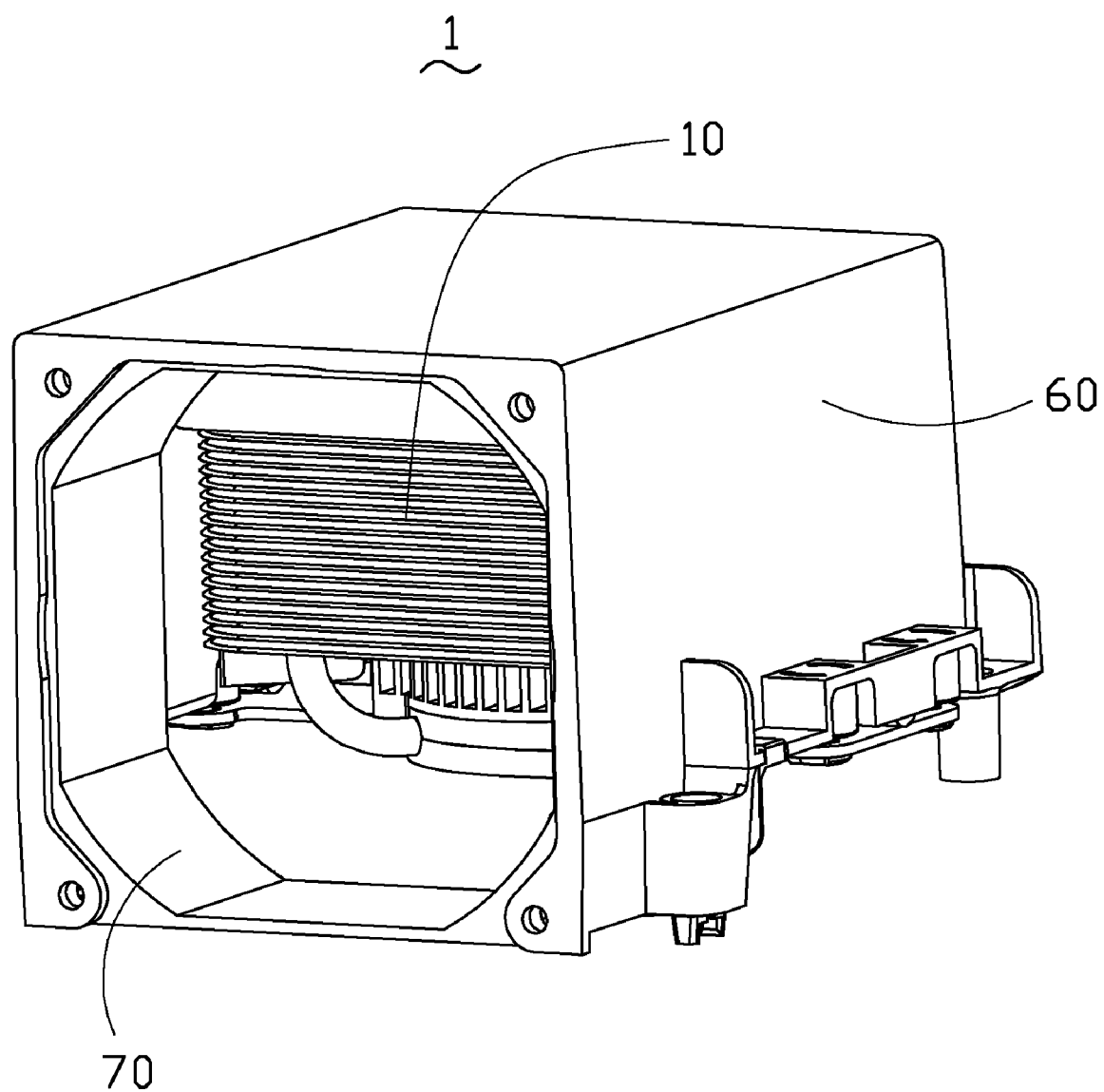
FIG. 1 is an isometric view of a heat exchange module in accordance with one embodiment of the present invention.
Figure 2:
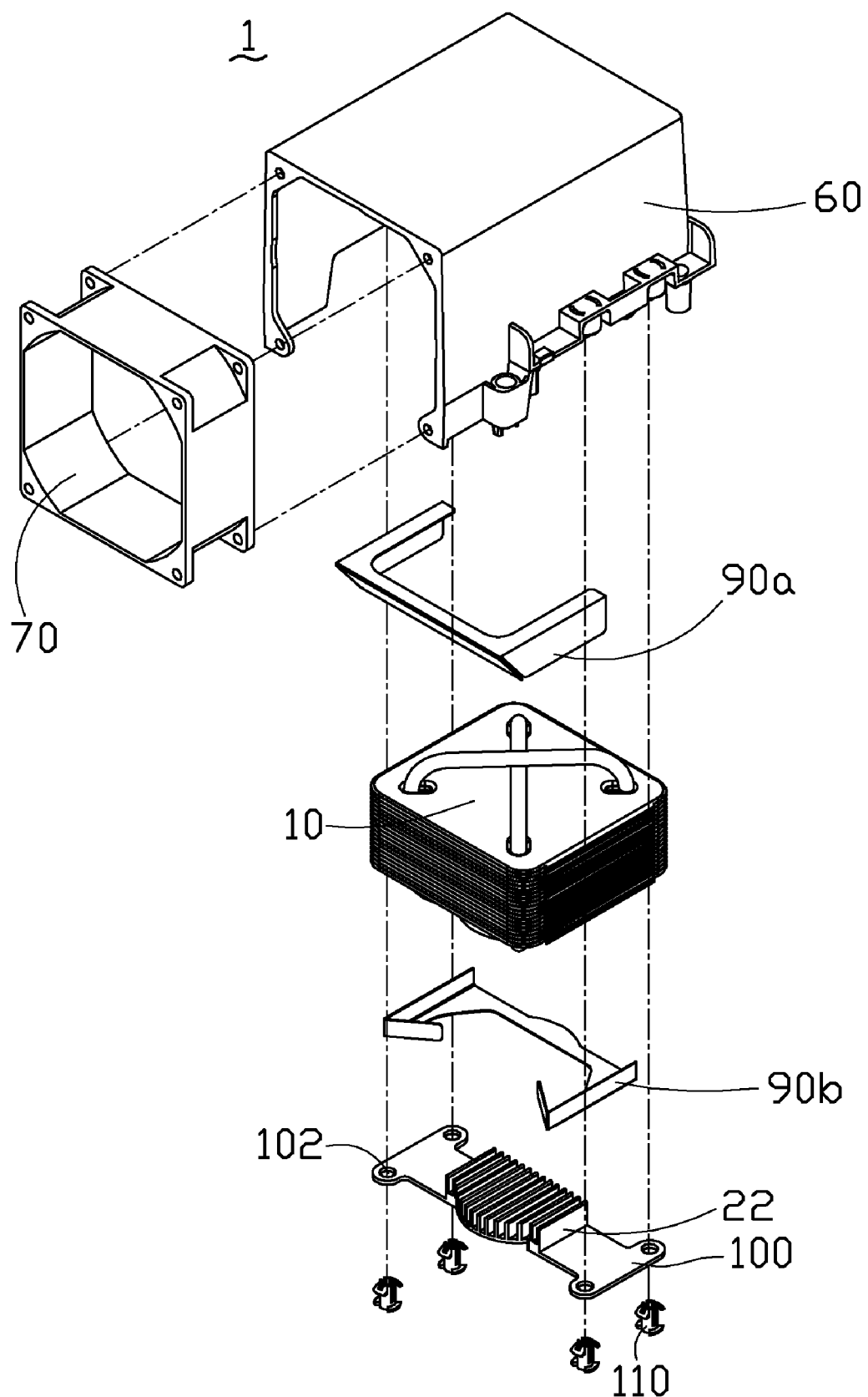
FIG. 2 is an exploded, isometric view of the heat exchange module of FIG. 1.

FIGS. 1 and 2 illustrate a heat exchange module 1 in accordance with one embodiment of the present invention. The heat exchange module 1 includes a loop-type heat exchange device 10, a fan duct 60, an electric fan 70 (only showing a fan housing thereof), first and second air-guiding members 90a, 90b, a mounting plate 100 and a plurality of fastening pins 110.

Figure 3:
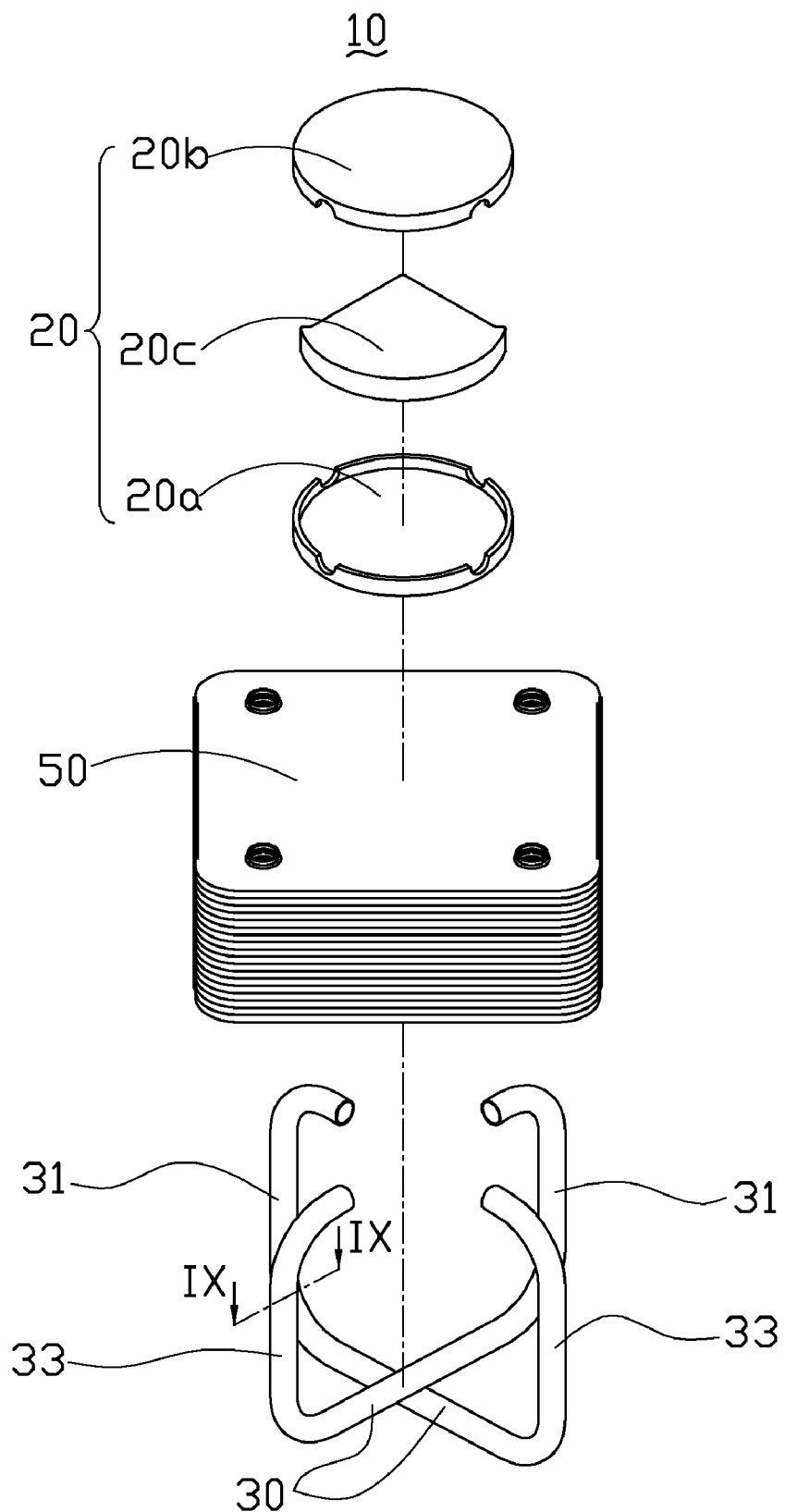
FIG. 3 is an exploded, isometric view of a loop-type heat exchange device of the heat exchange module of FIG. 2.

FIG. 3 shows the loop-type heat exchange device 10 in an upside down manner, which includes an evaporator 20, two conduits 30 and a condenser 50. The evaporator 20 includes top and bottom covers 20a, 20b connected together to define a chamber (not labeled) inside the evaporator 20 for receiving a wick structure 20c therein. The bottom cover 20b is adapted for contacting a heat source (not shown) such as a central processing unit (CPU) of a computer. Although the wick structure 20c is schematically shown, it is well known by those skilled in the art that the wick structure 20c may include sintered powders or a mesh structure made of metal wires or organic fibers woven together. Before the evaporator 20 is hermetically sealed, a working fluid (not shown) such as water or methanol is injected into the chamber of the evaporator 20 for saturating the wick structure 20c. The wick structure 20c has a size smaller than the chamber of the evaporator 20 and only occupies a portion of the chamber. As shown in FIG. 3, the wick structure 20c occupies about one fourth of a total area of the chamber. The chamber of the evaporator 20 is accordingly partitioned by the wick structure 20c into two major regions, i.e., a liquid micro-channel region filled with the wick structure 20c and an adjacent vapor-gathering region used to gather vapor generated in the evaporator 20, as will be described in more detail below.

Figure 9:
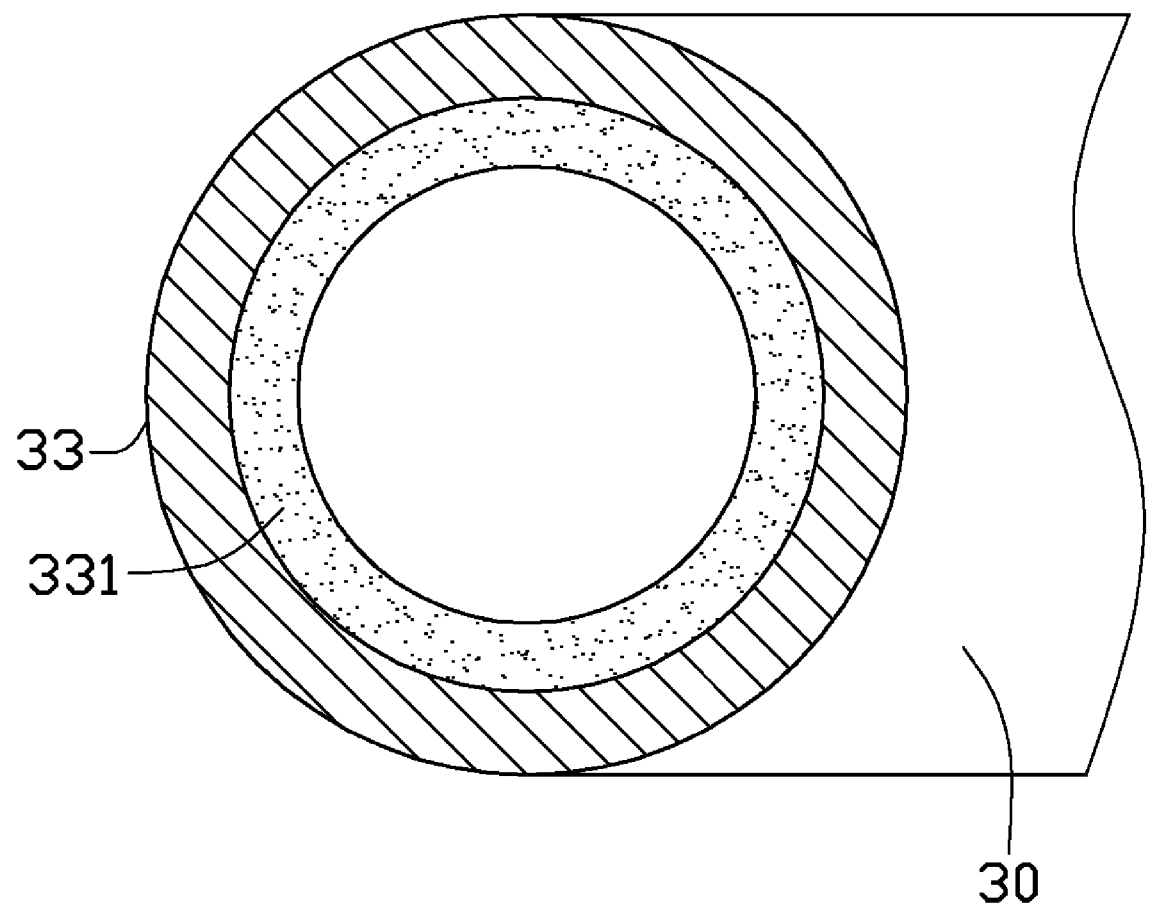
FIG. 9 is an enlarged, cross sectional view of a second pipe section of a conduit of the heat exchange device of FIG. 3, taken along line XI-XI thereof.

Each of the conduits 30 has a substantially U-shaped configuration and includes a first pipe section 31 and a second pipe section 33 positioned in parallel with the evaporating section 31. A wick structure 331 (shown in FIG. 9) is preferably formed inside the second pipe section 33 of each of the conduits 30. The wick structure 331 for each of the conduits 30 may include fine grooves integrally formed inside the conduits 30, mesh or bundles of fiber inserted into the conduits 30, or sintered powders combined to the conduits 30. The conduits 30 are typically made of high thermally conductive material such as copper, aluminum, silver or their alloys.

The condenser 50 includes a plurality of vertically spaced metal fins (not labeled). The metal fins of the condenser 50 are stacked along, and maintained in thermal contact with, the first and second pipe sections 31, 33 of each of the conduits 30, as particularly shown in FIG. 4. The first and second pipe sections 31, 33 of each of the conduits 30 are connected to the evaporator 20, wherein the first pipe sections 31 communicate with the vapor-gathering region while the second pipe sections 33 communicate with the micro-channel region of the chamber of the evaporator 20. As heat from the CPU is applied to the evaporator 20, the working fluid contained in the evaporator 20 evaporates into vapor after absorbing the heat. The generated vapor is gathered in the vapor-gathering region of the chamber of the evaporator 20 and then flows, via the first pipe sections 31 of the conduits 30, to the second pipe sections 33 of the conduits 30 where the vapor releases its latent heat of evaporation to the metal fins of the condenser 50. After the vapor releases the heat at the condenser 50, it turns into condensate. The condensate then returns back to the evaporator 20 where it is again available for evaporation, thus forming a heat transfer loop. Specifically, the condensate is drawn back to the evaporator 20 under the capillary forces developed by the wick structures 331 provided in the conduits 30 and the wick structure 20c provided in the evaporator 20. In the heat exchange device 10, since the micro-channel region of the evaporator 20 is filled with the wick structure 20c, the generated vapor in the evaporator 20 is thus prevented from moving backwards and proceeding along the second pipe sections 33 of the conduits 30; thus, the unidirectional working fluid movement mechanism along the heat transfer loop of the heat exchange device 10 is maintained. In order to prevent the vapor from being cooled prematurely as it flows along the first pipe sections 31 of the conduits 30, the first pipe sections 31 may be maintained not to thermally contact with the metal fins of the condenser 50.

Figure 6:
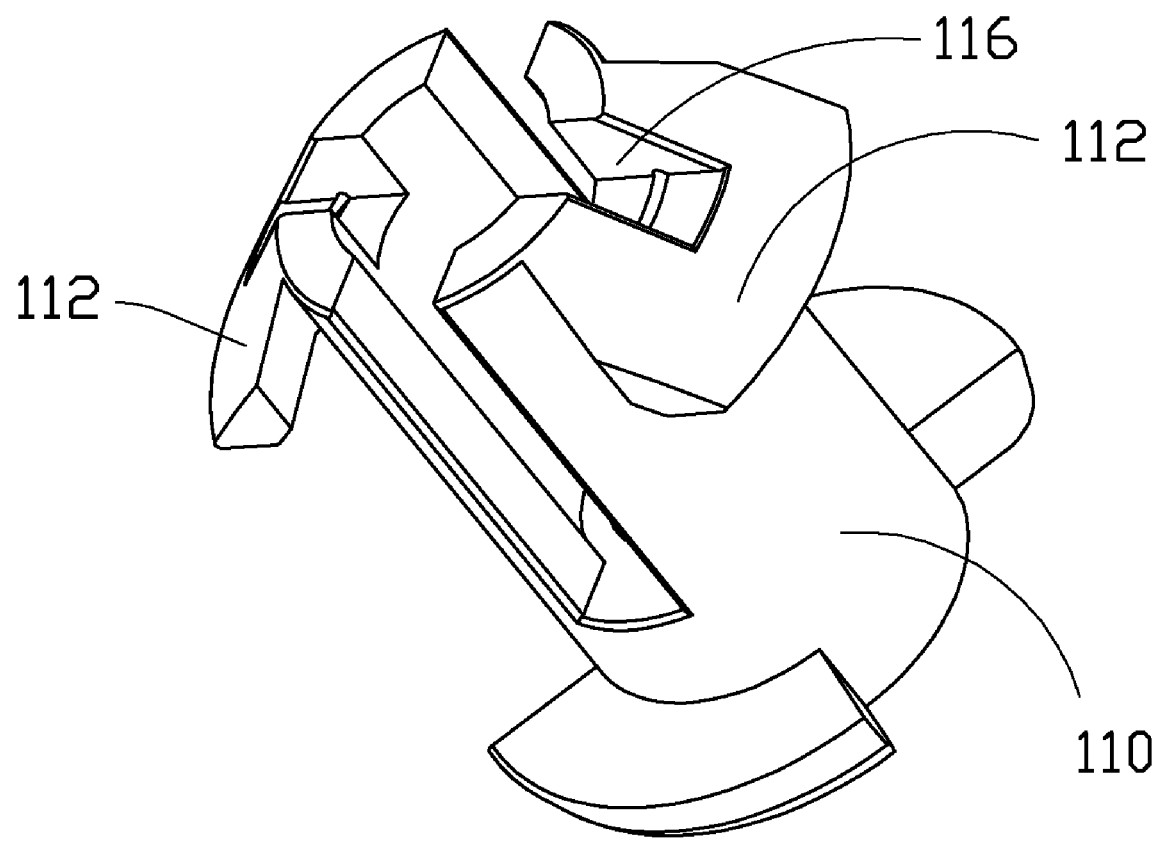
FIG. 6 is an enlarged view of a fastening pin of the heat exchange module of FIG. 2.

Referring back to FIG. 2, the mounting plate 100 has a heat sink 22 formed at a middle portion thereof. The heat sink 22 is integrally formed with the mounting plate 100. Four mounting holes 102 are defined at corners of the mounting plate 100, respectively. With reference also to FIG. 6, each of the fastening pins 110 has a pair of opposite barbs 112 extending outwardly and downwardly from a tip end thereof. In order to increase the resiliency of the barbs 112, a groove 116 is defined in each of the barbs 112.

Figure 4:
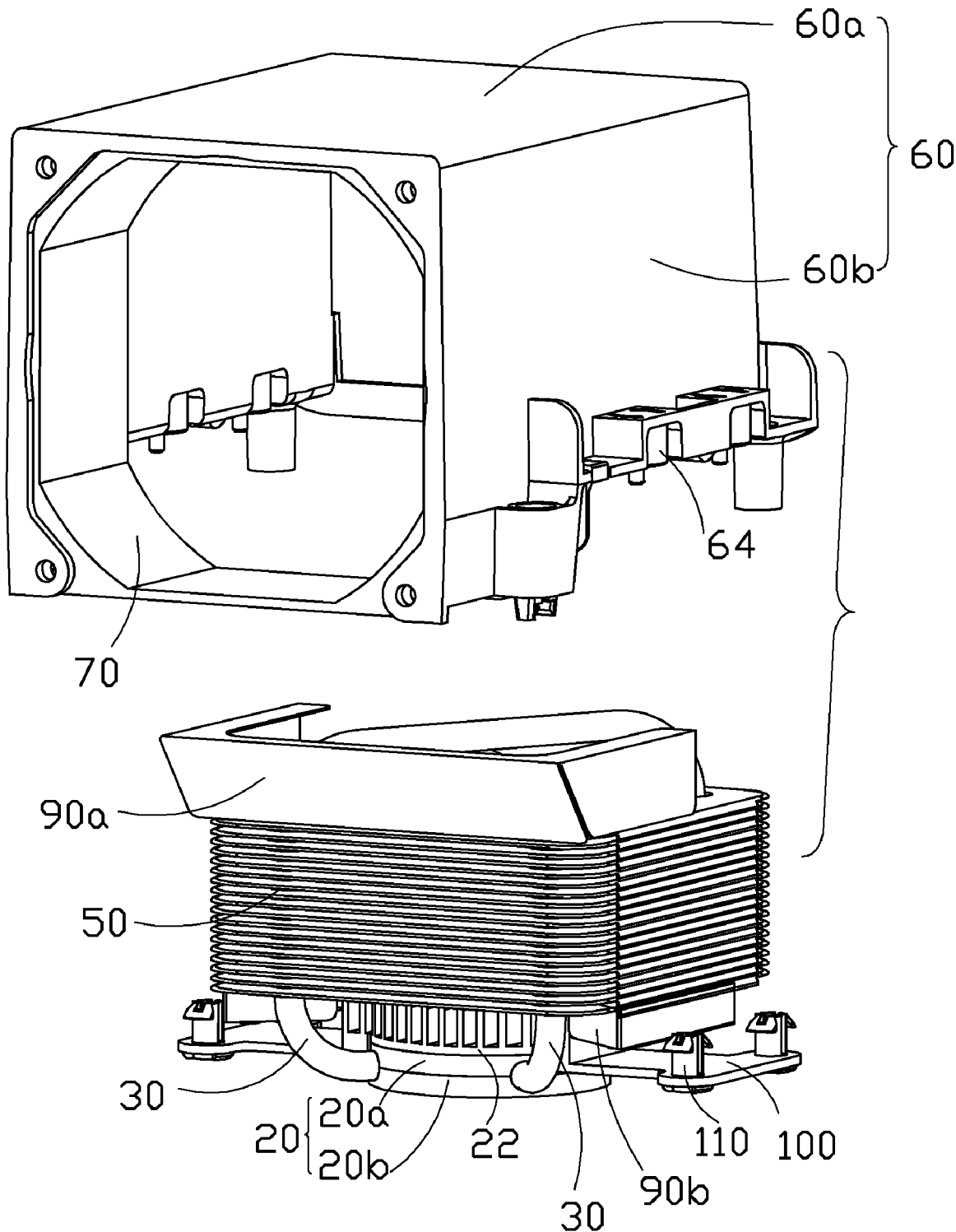
FIG. 4 is a partially assembled view of the heat exchange module of FIG. 2.
Figure 5:
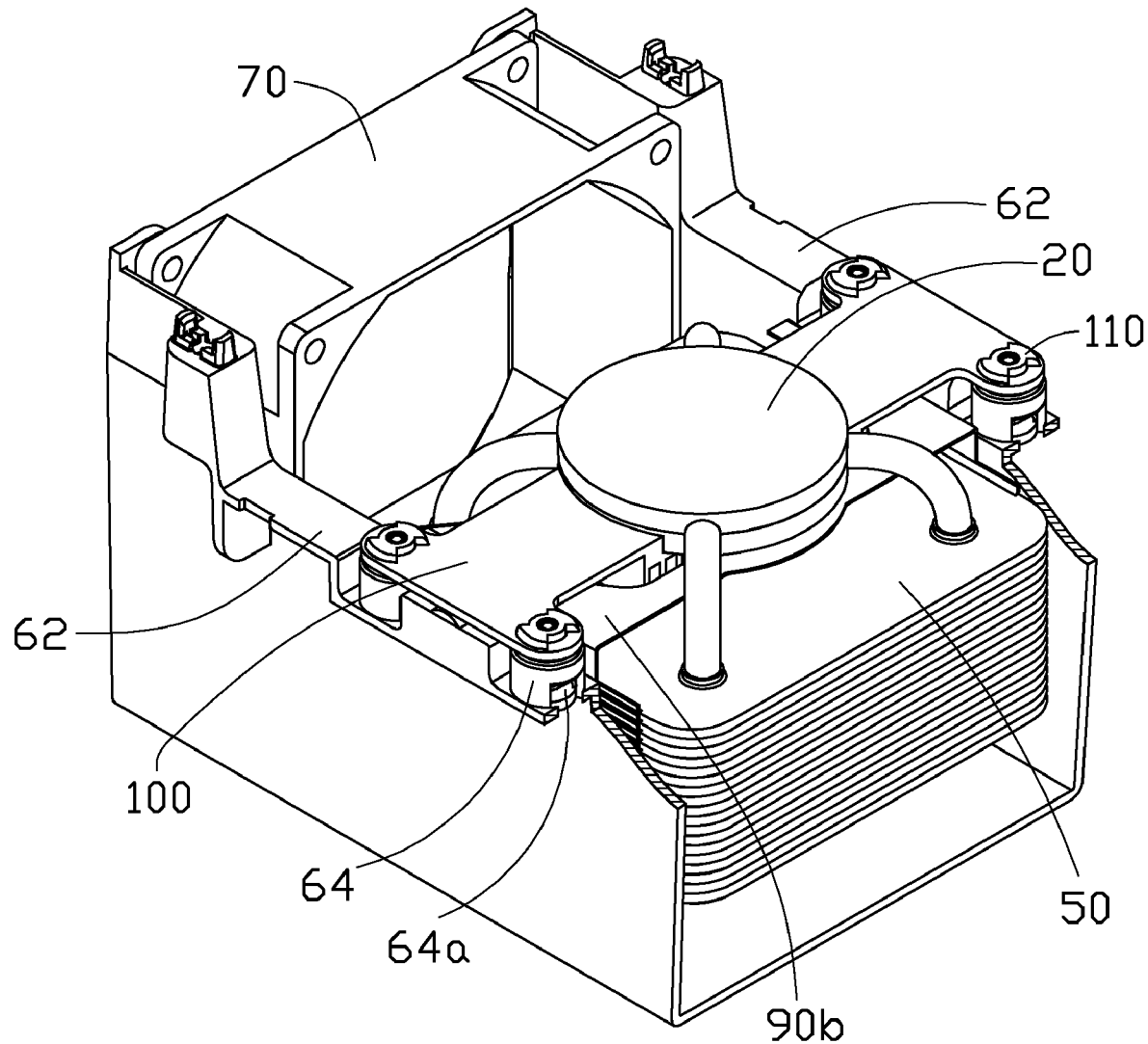
FIG. 5 is a fully assembled view of the heat exchange module of FIG. 2, in an upside down manner and with a portion thereof being removed for clarification.

The heat sink 22 formed on the mounting plate 100 is maintained in intimate thermal contact with the top cover 20a of the evaporator 20 and is aligned with the wick structure 20c contained in the evaporator 20, as shown in FIGS. 4-5. The heat sink 22 has a footprint sufficiently to cover the wick structure 20c but smaller than the top cover 20a of the evaporator 20. Since the micro-channel region in the evaporator 20 is connected with the adjacent vapor-gathering region, a small portion of the vapor generated in the evaporator 20 will also enter into the micro-channels defined by the wick structure 20c and accordingly accumulate in the micro-channel region due to a large vapor pressure of the vapor-gathering region. The heat sink 22 attached to the evaporator 20 is used to condense that portion of vapor accumulated in the micro-channel region, thus maintaining the working fluid to flow in the unidirectional direction along the heat transfer loop of the heat exchange device 10.

The fan duct 60, as shown in more detail in FIGS. 4-5, includes a top plate 60a and a pair of sidewalls 60b depending from opposite sides of the top plate 60a. A flange 62 extends outwardly from a bottom edge of each of the sidewalls 60b, as shown in FIG. 5. A plurality of mounting sleeves 64 is formed on the flange 62, aligned with the mounting holes 102 of the mounting plate 100.

With reference to FIGS. 2 and 4-5, in assembly, the mounting plate 100 is fixedly placed between the evaporator 20 and the condenser 50, with the heat sink 22 thermally contacting the evaporator 20. The air-guiding members 90a, 90b are respectively mounted to top and bottom sides of the condenser 50. Each of the air-guiding members 90a, 90b has an inclined surface (not labeled) provided near the electric fan 70 whereby an airflow generated by the electric fan 70 is guided to flow towards the condenser 50 and heat sink 22 to enhance heat dissipation effectiveness thereof. The fastening pins 110 extend respectively through the mounting holes 102 of the mounting plate 100 and then engage with the mounting sleeves 64 formed on the flanges 62 of the fan duct 60, whereby the loop-type heat exchange device 10 is secured within the fan duct 60. Specifically, each of the mounting sleeves 64 of the fan duct 60 defines a pair of opposite cutouts 64a corresponding to the barbs 112 of each of the fastening pins 110, as particularly shown in FIG. 5. The barbs 112 of the fastening pins 110 are deflected as the fastening pins 110 are inserted into the mounting sleeves 64. Then, the barbs 112 restore back to their original shapes and engage with the mounting sleeves 64 in the cutouts 64a. The electric fan 70 is secured to one side of the fan duct 60 for providing forced convection for the heat exchange device 10. After the heat exchange device 10 is secured within the fan duct 60, the second pipe sections 33 of the conduits 30 are located nearer to the electric fan 70 than the first pipe sections 31 of the conduits 30 in order to facilitate the heat exchange between the condenser 50 and the second pipe sections 33 of the conduits 30 as the vapor flows through the second pipe sections 33.

Figure 7:
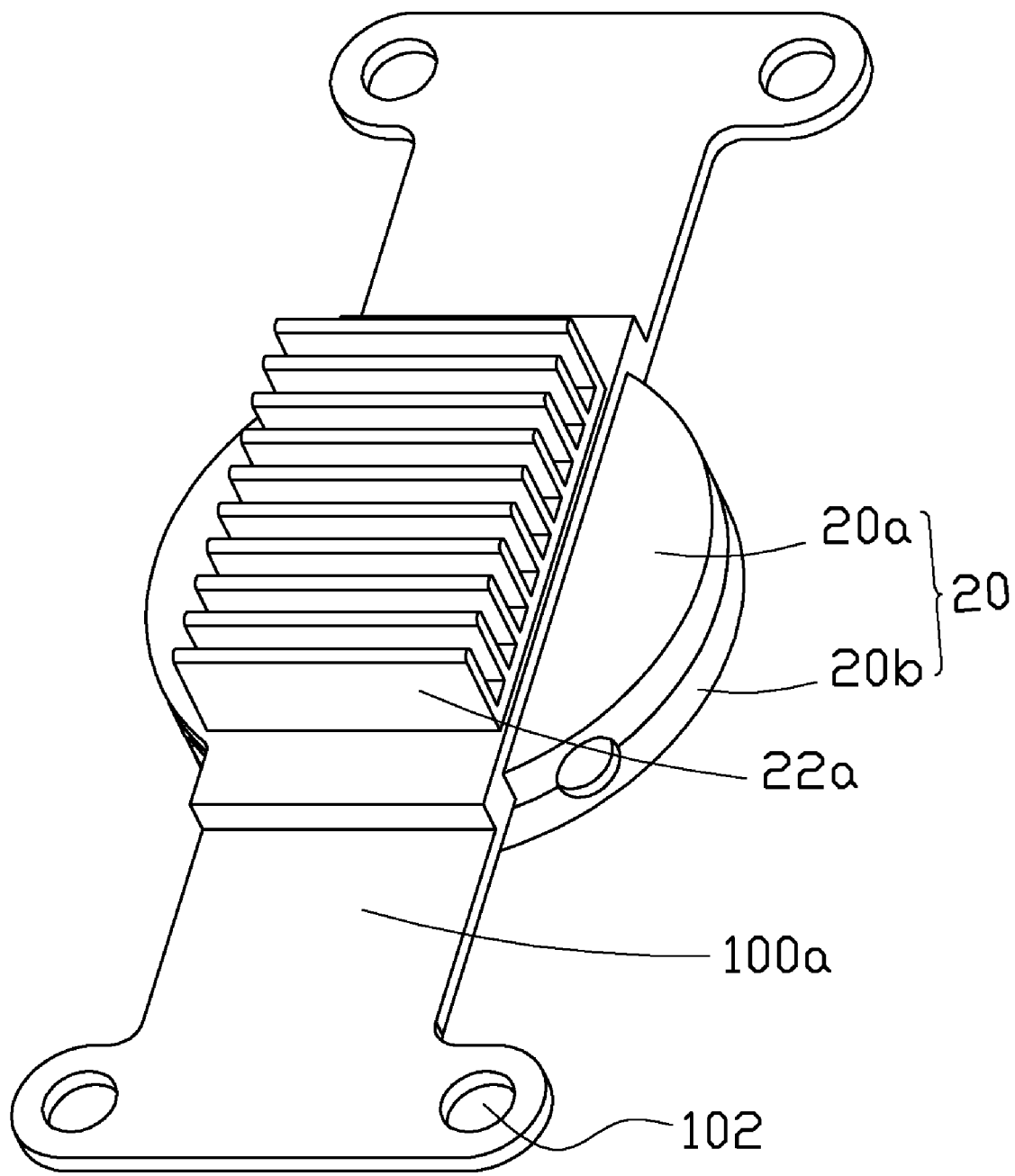
FIG. 7 is an enlarged, isometric view of a mounting plate of the heat exchange module of FIG. 2 in accordance with another example.
Figure 8:
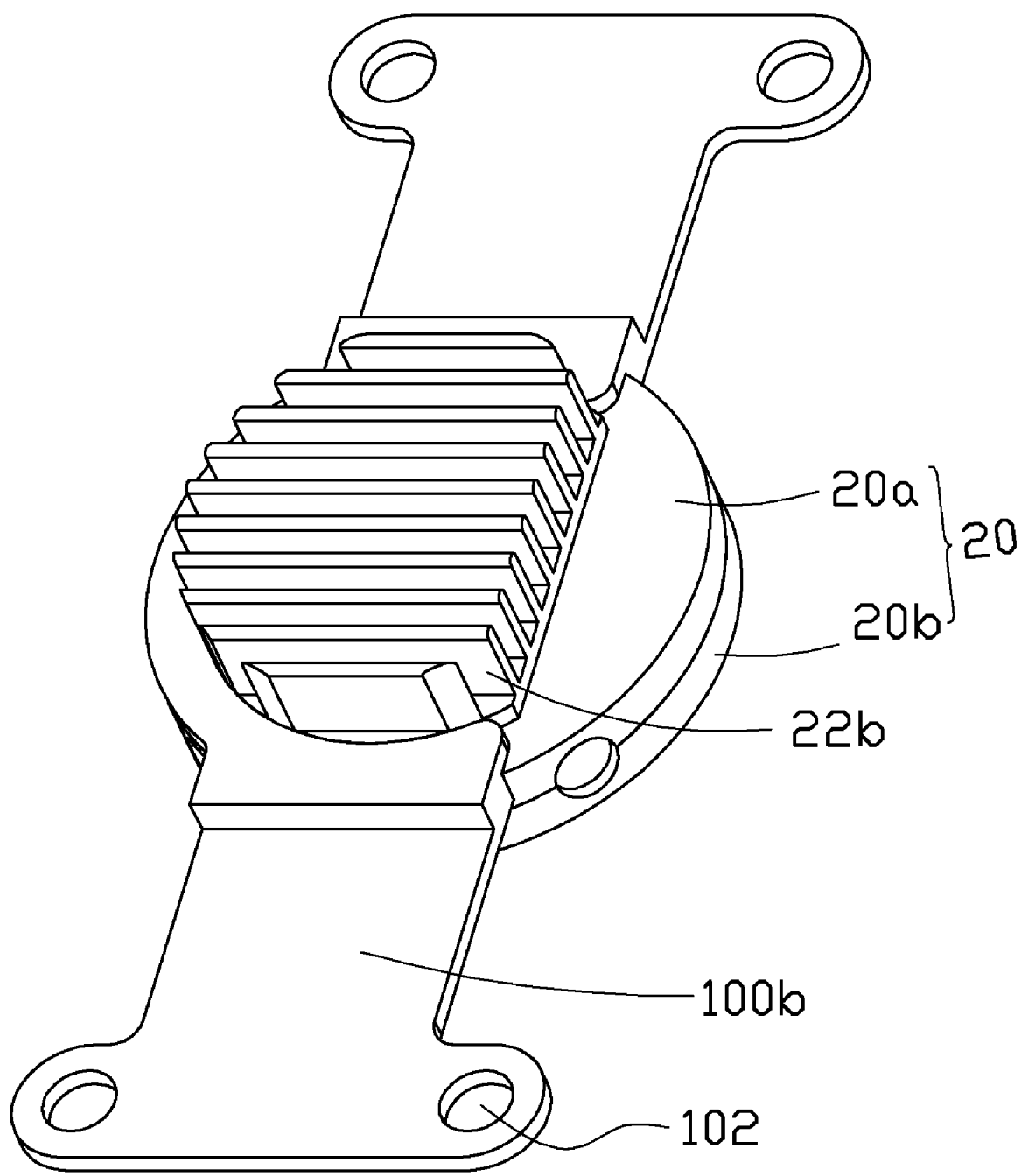
FIG. 8 is an enlarged, isometric view of a mounting plate of the heat exchange module of FIG. 2 in accordance with a further example.

The heat sink 22 used to cool the micro-channel region of the evaporator 20 may also be formed independently of the mounting plate 100. As shown in FIG. 7, the heat sink 22a after being made is attached to the mounting plate 100a by gluing or otherwise adhesively attached to the mounting plate 100a. As a further example shown in FIG. 8, the heat sink 22b is captured within an aperture (not labeled) defined in the mounting plate 100b and is directly attached to the top cover 20a of the evaporator 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat exchange module comprising:
   an evaporator defining therein a chamber for containing a wick structure saturated with a working fluid, the wick structure occupying a portion of the chamber;
   a condenser disposed above the evaporator, wherein the working fluid turns into vapor in the evaporator after absorbing heat and the vapor turns into condensate at the condenser after releasing the heat; and
   a heat sink attached to an outer surface of the evaporator and located in alignment with the wick structure contained in the evaporator;
   wherein the chamber of the evaporator is divided by the wick structure into a micro-channel region filled with the wick structure and an adjacent vapor-gathering region adapted for gathering the vapor generated in the evaporator;
   wherein the heat exchange module further comprises a conduit connecting the evaporator with the condenser, the conduit having a first pipe section connected to said vapor-gathering region and a second pipe section connected to said micro-channel region; and
   wherein a wick structure is provided inside said second pipe section of said conduit.

2. The heat exchange module of claim 1, wherein the heat sink is located between the evaporator and the condenser.

3. The heat exchange module of claim 1, wherein the condenser includes a plurality of metal fins stacked along said second pipe section of said conduit.

4. The heat exchange module of claim 1, further comprising an electric fan located near said second pipe section of said conduit for producing an airflow towards the condenser.

5. A heat exchange module comprising:
   an evaporator defining therein a chamber for containing a wick structure in which a working fluid is saturated, the wick structure occupying a portion of the chamber;
   a condenser disposed adjacent to the evaporator, wherein the working fluid turns into vapor in the evaporator after absorbing heat and the vapor turns into condensate at the condenser after releasing the heat;
   a fan duct receiving the evaporator and condenser substantially therein; and
   an electric fan attached to the fan duct for producing an airflow towards the condenser;
   wherein the heat exchange module further comprises a heat sink attached to an outer surface of the evaporator and located in alignment with the wick structure contained in the evaporator;
   wherein the evaporator and the condenser are secured to the fan duct by a mounting plate;
   wherein the fan duct includes a top plate and a pair of sidewalls depending from opposite sides of the top plate and the mounting plate is secured to the sidewalls of the fan duct by a plurality of fasteners; and
   wherein a plurality of mounting sleeves is formed on the sidewalls of the fan duct and the fasteners engage with the mounting sleeves.

6. The heat exchange module of claim 5, wherein the heat sink is integrally formed with the mounting plate.

7. The heat exchange module of claim 5, further comprising first and second air-guiding members disposed adjacent to the condenser for guiding the airflow of the electric fan towards the condenser and the heat sink.

8. A heat exchange device comprising:
   an evaporator for contacting with a heat-generating electronic component, the evaporator having a wick structure therein to define an inner chamber of the evaporator into a liquid micro-channel region by the wick structure and a vapor-gathering region neighboring the liquid micro-channel region, the wick structure being saturated with working fluid;
   a condenser located adjacent to the evaporator; and
   a conduit having a first section fluidically connecting with the vapor-gathering region and a second section thermally connecting with the condenser and fluidically connecting with the liquid micro-channel region of the evaporator, the second section being provided with a wick structure;
   wherein the working fluid becomes vapor in the vapor-gathering region by absorbing heat from the heat-generating electronic component, the vapor flowing to the first section and then to the second section of the conduit, in the second section, the vapor becomes liquid by releasing the heat to the condenser, and the liquid is drawn by the wick structures of the second section of the conduit and the evaporator to reach the micro-channel region of the evaporator.

9. The heat exchange device of claim 8, wherein the condenser comprises a plurality of metal fins and the condenser is mounted above the evaporator.

10. The heat exchange device of claim 9 further comprising a heat sink located between the condenser and the evaporator, the heat sink thermally contacting with the evaporator and located corresponding to the wick structure of the evaporator.

11. The heat exchange device of claim 10 further comprising an air guiding means for guiding an airflow to flow through the condenser and the heat sink.

* * * * *

UNITED STATES PATENT AND TRADEMARK OFFICE
CERTIFICATE OF CORRECTION

| | | |
|---|---|---|
| PATENT NO. | : 7,665,509 B2 | Page 1 of 1 |
| APPLICATION NO. | : 11/307154 | |
| DATED | : February 23, 2010 | |
| INVENTOR(S) | : Tung et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1066 days.

Signed and Sealed this

Seventh Day of December, 2010

David J. Kappos
*Director of the United States Patent and Trademark Office*